(12) United States Patent
Wu

(10) Patent No.: US 6,277,676 B1
(45) Date of Patent: Aug. 21, 2001

(54) METHOD OF FABRICATING CAPACITORS AND DEVICES IN MIXED-SIGNAL INTEGRATED CIRCUIT

(75) Inventor: Chi-Hsi Wu, Taiwan (CN)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 09/515,119

(22) Filed: Feb. 29, 2000

(30) Foreign Application Priority Data

Dec. 10, 1999 (TW) ............................................... 088121712

(51) Int. Cl.⁷ ..................... H01L 21/335; H01L 21/8232
(52) U.S. Cl. ........................................... 438/142; 438/283
(58) Field of Search ................................ 438/142, 145, 438/164, 197, 283, 526, 296, 618, 697, 740; 257/296, 314, 401, 623, 552, 565

(56) References Cited

U.S. PATENT DOCUMENTS 5,889,315 * 3/1999 Farrenkopf et al. ................ 257/552
6,022,794 * 2/2000 Hsu ...................................... 438/526
6,030,872 * 2/2000 Lu et al. .............................. 438/283
6,034,416 * 3/2000 Uehara et al. ....................... 257/623

* cited by examiner

Primary Examiner—David Nelms
Assistant Examiner—Phuc T. Dang
(74) Attorney, Agent, or Firm—Jiawei Huang; J.C. Patents

(57) ABSTRACT

A method of forming the capacitors and devices in a mixed-signal integrated circuit. A gate dielectric layer and a first conductive layer are sequentially formed over the substrate regions for forming desired high operation voltage devices and capacitors. A dielectric layer and a second conductive layer are sequentially formed over the first conductive layer and the substrate region for forming desired low operation voltage devices. Photolithographic and etching processes are carried out twice to pattern the gate dielectric layer, the first conductive layer, the dielectric layer and the second conductive layer so that the gate terminals of the high and low voltage devices as well as the capacitors are formed in the same process.

6 Claims, 4 Drawing Sheets

METHOD OF FABRICATING CAPACITORS AND DEVICES IN MIXED-SIGNAL INTEGRATED CIRCUIT

CROSS-REFERENCE TO RELATED APPLICATION

This application claims the priority benefit of Taiwan application serial no. 88121712, filed Dec. 10, 1999.

BACKGROUND OF THE INVENTION

1. Field of the Invention

The present invention relates to a method of fabricating the capacitors and devices of a semiconductor device. More particularly, the present invention relates to a method of fabricating the dual polysilicon layer capacitors and the devices of a dual operation voltage mixed-signal integrated circuit.

2. Description of the Related Art

On the eve of the twenty-first century, semiconductor applications continue to expand. A large quantity of semiconductor devices having a variety of functions is used in computer systems, communication equipment and many consumer electronic products.

To cater to some specific customer applications, application-specific integrated circuits (ASIC) are fabricated. In addition, in order for an electronic product to be light, compact and speedy, system on chip (SOC) design is often adopted in the fabrication of semiconductor devices. In other words, separately manufactured electronic devices are now formed in a single silicon chip. Currently, a type of application-specific circuit known as a mixed-signal integrated circuit has been developed. The mixed-signal circuit is formed by integrating a capacitor and a complementary metal oxide semiconductor (CMOS) device together. At first, all the CMOS devices operate at a single gate voltage. Recent advances in manufacturing technologies have made it possible to include two or more types of CMOS devices, each operating at its own operational voltage. For example, an integrated circuit having CMOS devices capable of working in dual or even triple voltage mode are fabricated on a silicon chip.

FIGS. 1A through 1C are schematic cross-sectional views showing the steps for producing the gate oxide layers of a conventional integrated circuit that operates in dual voltage mode.

As shown in FIG. 1A, gate oxide layers 102 are formed on portions of a substrate 100. The substrate 100 has a well region 104 and shallow trench isolation structures 106 therein. The gate oxide layer 102 is formed by thermal oxidation. A patterned photoresist layer 108 is formed over the substrate 100, which comprises substrate regions 100*a* and 100*b*. The photoresist layer 108 covers the substrate region 100*a* for forming the desired high operation voltage devices so that the substrate region 100*b* for forming the desired low operation voltage devices is exposed.

As shown in FIG. 1B, the gate oxide layer 102 on substrate regions 100*b* is removed while retaining the gate oxide layer 102*a* on the substrate region 100*a*.

As shown in FIG. 1C, the patterned photoresist layer 108 is removed and then another thermal oxidation is carried out. Hence, a gate oxide layer 110 is formed on the substrate 100 in the substrate region 100*b*. Meanwhile, moisture and oxygen can still diffuse and react with the existing gate oxide layer 102*a* to form a thicker oxide layer 112.

Consequently, by controlling the parameters during these two thermal oxidations, gate oxide layers of different thicknesses are formed in various regions. Thus, devices having the desired working voltages are formed in desired locations.

In the conventional method of fabricating the dual thickness gate oxide layer, a portion of the gate oxide layer has to be covered by a photoresist layer. Hence, if the photoresist layer is not thoroughly removed, residual defects may remain above the gate oxide layer to compromise device reliability. In addition, if a capacitor having polysilicon upper and lower electrodes needs to be formed at the same time as the gate terminal, only the polysilicon gate layer can serve as the lower electrode of the capacitor. In other words, to form the capacitor, steps still have to be undertaken to form a dielectric layer above the lower electrode followed by an upper electrode above the dielectric layer. Hence, production time and cost are increased.

SUMMARY OF THE INVENTION

The invention provides a method of fabricating the capacitors and devices of a mixed-signal integrated circuit. A substrate having a plurality of shallow trench isolation structures therein is provided. The substrate can be divided into regions for forming capacitors, first devices and second devices. The capacitor is formed above one of the shallow trench isolation (STI) structures. The first devices and the second devices are formed above the substrate between the STI structures. A first gate dielectric layer is formed over the substrate, and then a first conductive layer is formed over the first gate dielectric layer. The first conductive layer and the first gate dielectric layer above the regions for forming the first devices are removed so that the substrate is exposed. A dielectric layer is formed over the first conductive layer and the exposed substrate. A second conductive layer is formed over the dielectric layer. The second conductive layer and the dielectric layer are patterned to form an upper electrode and a capacitor dielectric layer in the capacitor regions. Meanwhile, the second conductive layer and the dielectric layer above the first conductive layer within the second device regions are removed while retaining the second conductive layer and the dielectric layer over the first device regions. The capacitor region and the first conductive layer and the first gate dielectric layer in the first device region are patterned. Ultimately, a lower electrode is formed in each capacitor region, a second gate dielectric layer and a first gate terminal are formed in each first device region and a third gate dielectric layer and a second gate terminal are formed in each second device region.

According to the invention, the steps of forming the mixed-signal integrated circuit includes sequentially forming a gate dielectric layer and a first conductive layer over the substrate regions for forming the high voltage devices and the capacitors. Thereafter, a dielectric layer and a second conductive layer are sequentially formed over the first conductive layer and the substrate region for forming the low voltage devices. Photolithographic and etching processes are conducted twice to pattern the gate dielectric layer, the first conductive layer, the dielectric layer and the second conductive layer so that the gate terminals of the high and low voltage devices as well as the capacitor are formed at the same time.

Accordingly, the present invention is to provide an improved method of fabricating the capacitors and the devices of a mixed-signal integrated circuit. The method prevents possible formation of residual defects over gate oxide layers that has been covered by photoresist and simplifies the process of fabricating the capacitor by integrating some of the steps for forming the dielectric layer and the polysilicon upper electrode.

In the patterning process, since the photoresist layer is not in direct contact with the gate dielectric layer, reliability of the gate dielectric layer is improved. In addition, the lower electrodes of the capacitors and the gate terminals of the high voltage devices are formed together in the same step. The gate dielectric layer of the low voltage devices and the dielectric layer of the capacitor are formed together in the same step. Similarly, the gate terminal of the low voltage devices and the upper electrodes of the capacitors are formed together in the same step. Hence, the steps involved in the invention can be easily integrated with standard CMOS fabrication procedure for a higher yield.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
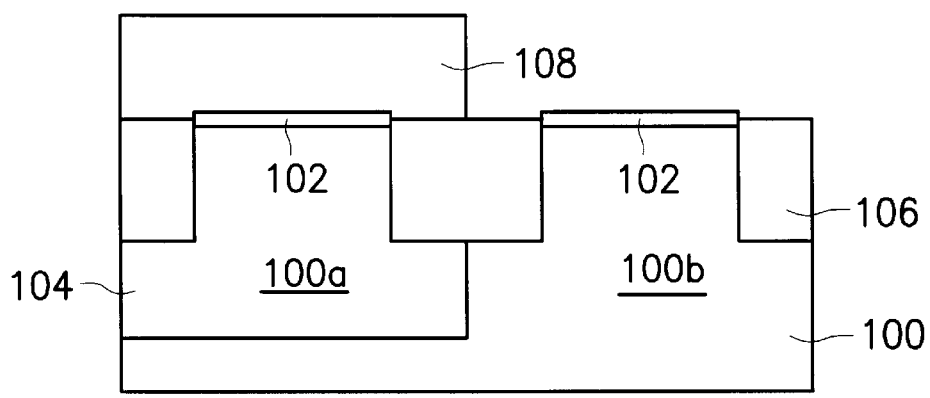
FIGS. 1A through 1C are schematic cross-sectional views showing the steps for producing the gate oxide layers of a conventional integrated circuit that operates in dual voltage mode.
Figure 1B:
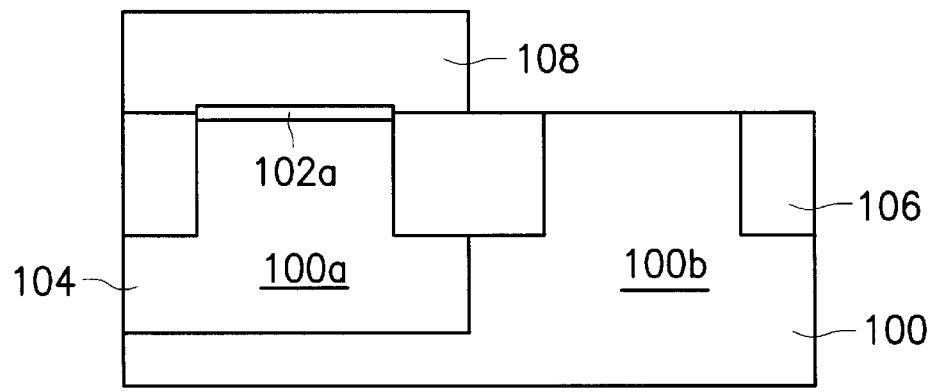
Figure 1C:
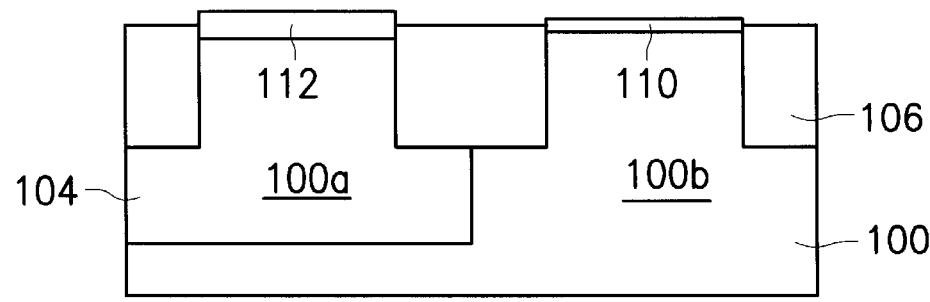

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic cross-sectional views showing the steps for producing the capacitors and the devices in a mixed-signal integrated circuit according to one preferred embodiment of the invention.

Figure 2A:
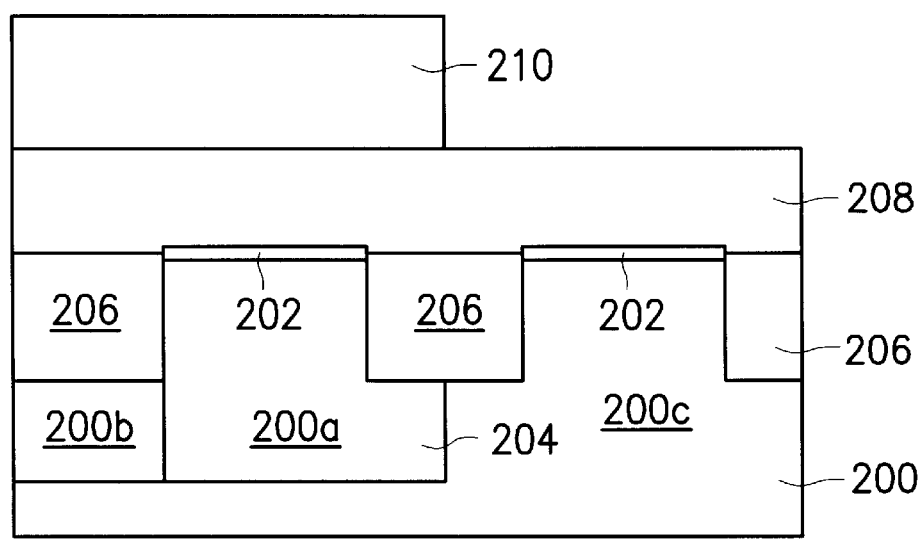
FIGS. 2A through 2E are schematic cross-sectional views showing the steps for producing the capacitors and the devices in a mixed-signal integrated circuit according to one preferred embodiment of this invention.

As shown in FIG. 2A, a substrate 200 that has well regions 204 and isolation structures 206 therein is provided. The isolation structures 206 can be shallow trench isolation (STI) structures, for example. Gate dielectric layers 202 are formed on the substrate 200. The gate oxide layers 202 can be a silicon oxide layer having a thickness of about 120 Å formed, for example, by thermal oxidation.

A conductive layer 208 is formed over the gate dielectric layer 202 and the isolation structures 206. The conductive layer 208 can be a polysilicon layer formed, for example, by low-pressure chemical vapor deposition. A patterned photoresist layer 210 is formed over the substrate 200. The photoresist layer 210 covers substrate regions 200a where the desired high voltage devices are formed and substrate regions 200b where the desired capacitors are formed. The exposed substrate regions 200c are areas for forming the low voltage devices. In general, subsequently formed capacitors are formed above the isolation structures 206, while the subsequently formed high voltage devices and low voltage devices are formed between the isolation structures 206.

Figure 2B:
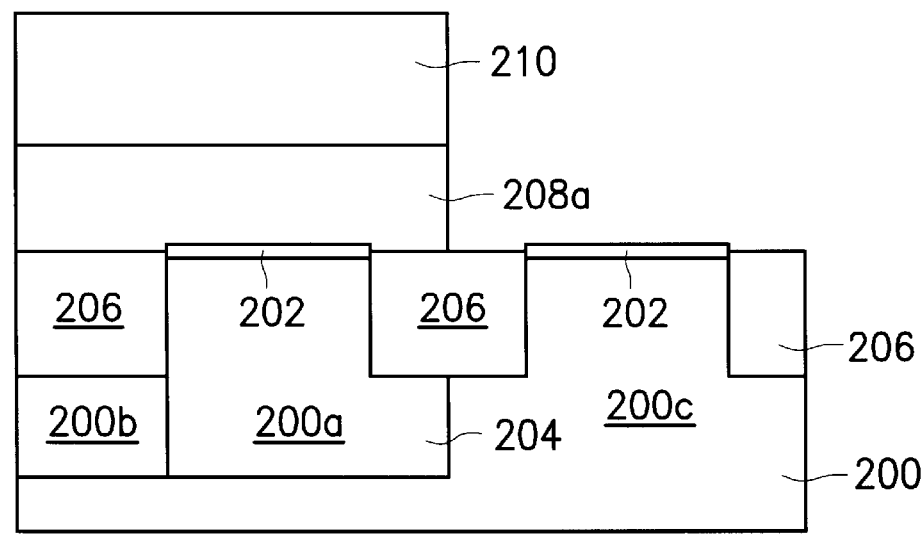

As shown in FIG. 2B, the conductive layer 208 and the gate dielectric layer 202 above the region 200c for forming the low voltage devices are removed. Hence, a conductive layer 208a and a gate dielectric layer 202a remain on top of regions 200a and 200b. The conductive layer 208a serves as the gate terminal of subsequently formed high voltage devices and the lower electrode of subsequently formed capacitors. The conductive layer 208 and the gate dielectric layer 202 above substrate region 200c can be removed, for example, by dry etching.

Figure 2C:
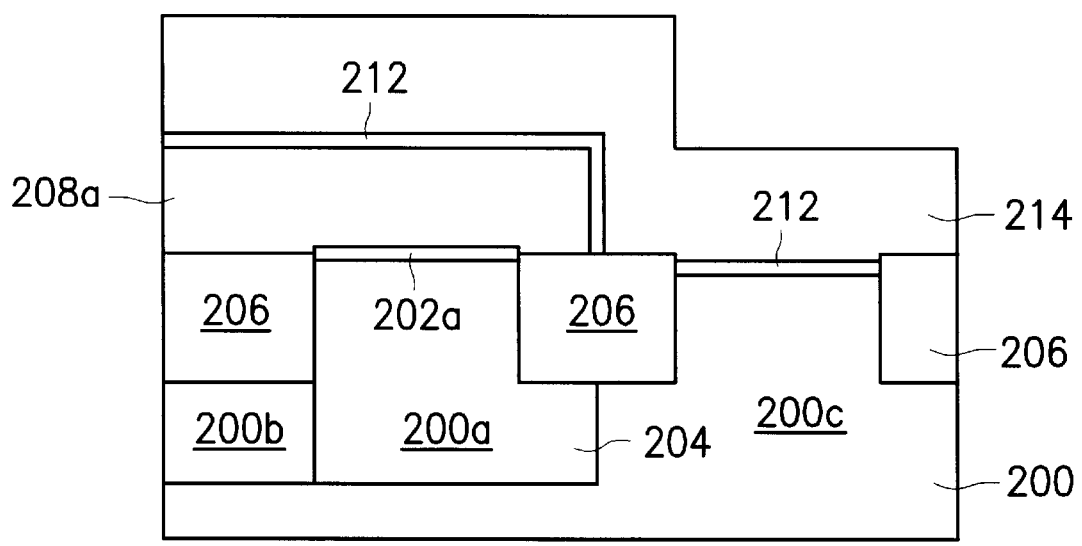

As shown in FIG. 2C, the patterned photoresist layer 210 is removed. A dielectric layer 212 is formed over the conductive layer 208a and the substrate 200. The dielectric layer 212 serves as the gate dielectric layer of the low voltage devices as well as the dielectric layer of the capacitors. The dielectric layer 212 can be a silicon oxide layer having a thickness less than the gate dielectric layer 202a, of about 70 Å, formed by thermal oxidation, for example. A conductive layer 214 is formed over the dielectric layer 212. The conductive layer 214 can be a polysilicon layer formed, for example, by low-pressure chemical vapor deposition.

Figure 2D:
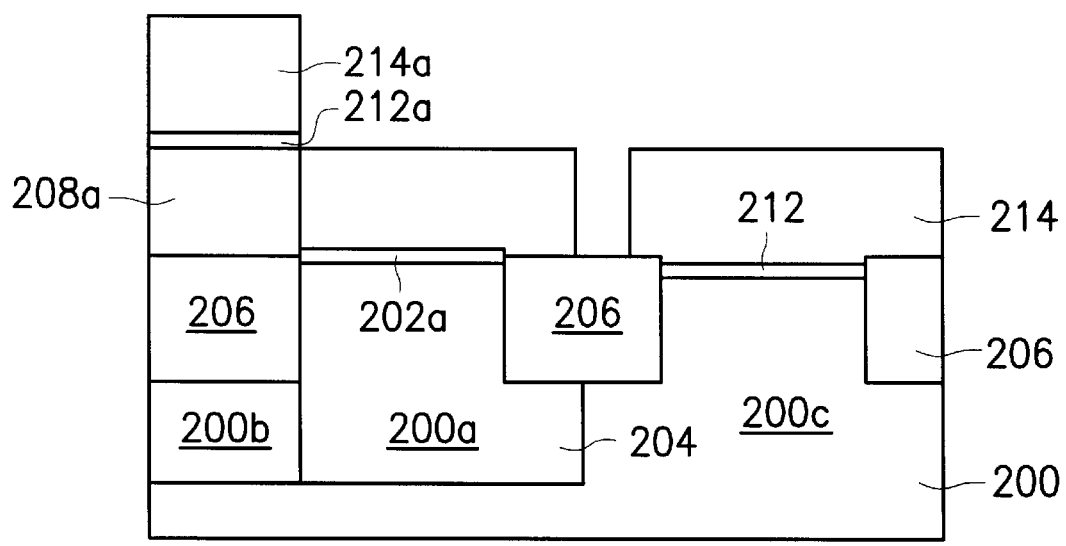

As shown in FIG. 2D, photolithographic and etching operations are carried out to pattern the conductive layer 214 and the dielectric layer 212 into a conductive layer 214a and a dielectric layer 212a. The conductive layer 214a and the dielectric layer 212a subsequently become the upper electrode and the dielectric layer of a capacitor, respectively. In the process of patterning out the conductive layer 214a and the dielectric layer 212a, the conductive layer 214 and the dielectric layer 212 in substrate regions 200c are protected by a mask layer. Hence, the conductive layer 214 and the dielectric layer 212 remain on top of the substrate regions 200c for forming the low voltage devices. However, the conductive layer 214 and the dielectric layer 212 inside the substrate regions 200a for forming the high voltage devices are removed.

Figure 2E:
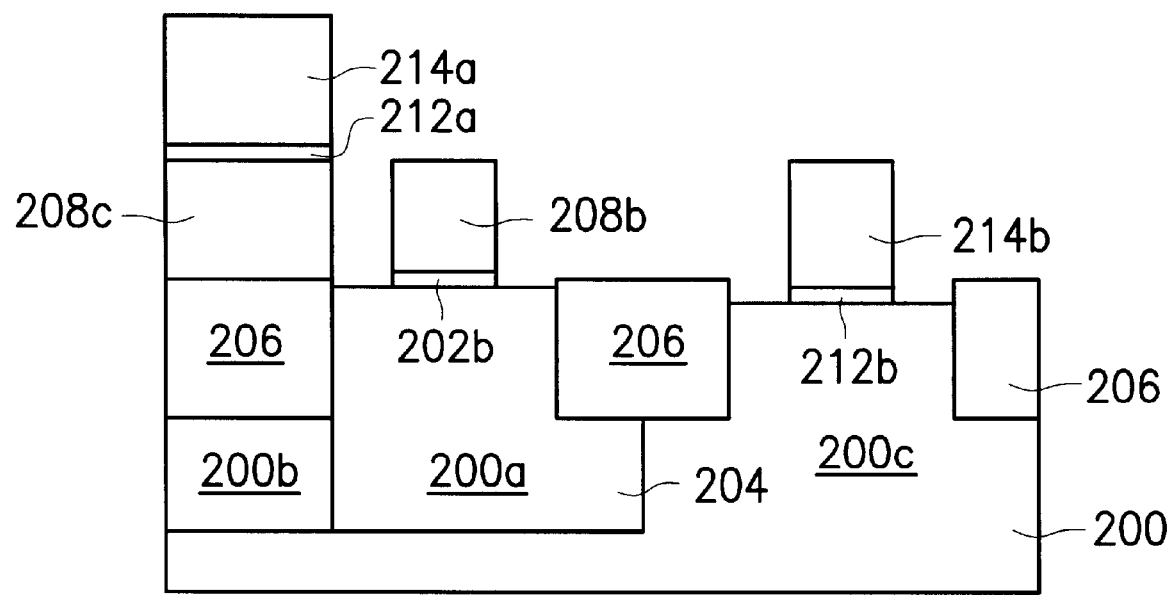

As shown in FIG. 2E, photolithographic and etching operations are again conducted to pattern the conductive layer 208a, the conductive layer 214, the gate dielectric layer 202a and the dielectric layer 212, thereby forming the lower electrode 208c of the capacitor, the gate terminal 208b and the gate dielectric layer 202b of the high voltage devices, and the gate terminal 214b and the gate dielectric layer 212b of the low voltage devices. Therefore, gate terminals are formed in substrate regions 200a and 200c while capacitors are formed in regions 200c at the same time. Since conventional processes are used in subsequent operations, detailed description is omitted here.

In the invention, a gate dielectric layer and a first conductive layer are sequentially formed over the substrate regions for forming the high voltage devices and the capacitors. A dielectric layer and a second conductive layer are then sequentially formed over the first conductive layer and the substrate region for forming the low voltage devices. Photolithographic and etching processes are carried out twice to pattern the gate dielectric layer, the first conductive layer, the dielectric layer and the second conductive layer so that the gate terminals of the high and low voltage devices as well as the capacitor are formed at the same time.

In the patterning process, no photoresist layer is in direct contact with the gate dielectric layer. Hence, reliability of the gate dielectric layer is improved. In addition, the lower electrodes of the capacitors and the gate terminals of the high voltage devices are formed in the same step. The gate dielectric layer of the low voltage devices and the dielectric layer of the capacitor are formed in the same step. Similarly, the gate terminal of the low voltage devices and the upper electrodes of the capacitors are formed in the same step. Hence, the steps involved in the invention can be easily integrated with standard CMOS fabrication procedure for a higher yield.

It will be apparent to those skilled in the art that various modifications and variations can be made to the structure of the present invention without departing from the scope or spirit of the invention. In view of the foregoing, it is intended that the present invention cover modifications and variations of the invention provided they fall within the scope of the following claims and their equivalents.

What is claimed is:

1. A method of manufacturing the capacitors and devices of a mixed-signal integrated circuit, comprising the steps of:

proveding a substrate having a plurality of isolation structures therein, wherein the substrate can be further divided into a region for forming capacitors, a region for forming a first type of devices and a region for forming a second type of device, and wherein the region for forming the desired capacitor is located above the isolation structures while the regions for forming the desired first and second devices are located above the substrate and between the isolation structures, wherein the region for forming the first type of devices is a region for forming low operation voltage devices;

forming a first gate dielectric layer over the substrate;

forming a first conductive layer over the first gate dielectric layer;

removing the first conductive layer and the first gate dielectric layer above first type device region so that the substrate in that region is exposed while the first conductive layer and the first gate dielectric layer within the capacitor-forming region and the second type device region arc retained;

forming a dielectric layer over the first conductive layer and the exposed substrate in the first type device region;

forming a second conductive over the dielectric layer;

patterning the second conductive layer and the dielectric layer so that a upper electrode and a capacitor dielectric layer are formed from the second conductive layer and the dielectric layer, respectively, in the capacitor-forming region, the second conductive layer and the dielectric layer above the first conductive layer within the second device-forming region are removed, and the second conductive layer and dielectric layer above the first device-forming region are retained; and patterning the first conductive layer and the first gate dielectric layer in the capacitor-forming region the and the second device-forming region together with the second conductive layer in the first device-forming region so that a lower electric is formed in the capacitor-forming region, a second gate dielectric layer and a first gate terminal are formed in the first device-forming region and a third gate dielectric layer and a second gate terminal are formed in the second device-forming region.

2. The method of claim 1, wherein the second device-forming region is a region for forming high operation voltage devices.

3. The method of claim 1, wherein material for forming the first gate dielectric layer includes silicon oxide.

4. The method of claim 1, wherein material for forming the first conductive layer includes polysilicon.

5. The method of claim 1, wherein material for forming the dielectric layer includes silicon oxide.

6. The method of claim 1, wherein material for forming the second conductive layer includes polysilicon.

* * * * *